(12) United States Patent
Ohno et al.

(10) Patent No.: US 6,765,241 B2
(45) Date of Patent: Jul. 20, 2004

(54) GROUP III NITRIDE SEMICONDUCTOR DEVICE OF FIELD EFFECT TRANSISTOR TYPE HAVING REDUCED PARASITIC CAPACITANCES

(75) Inventors: Yasuo Ohno, Minato-ku (JP); Nobuyuki Hayama, Minato-ku (JP); Kensuke Kasahara, Minato-ku (JP); Tatsuo Nakayama, Minato-ku (JP); Hironobu Miyamoto, Minato-ku (JP); Yuji Takahashi, Minato-ku (JP); Yuji Ando, Minato-ku (JP); Kohji Matsunaga, Minato-ku (JP); Masaaki Kuzuhara, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/362,883
(22) PCT Filed: Aug. 30, 2001
(86) PCT No.: PCT/JP01/07463
§ 371 (c)(1),
(2), (4) Date: Feb. 27, 2003
(87) PCT Pub. No.: WO02/21601
PCT Pub. Date: Mar. 14, 2002

(65) Prior Publication Data
US 2003/0151064 A1 Aug. 14, 2003

(30) Foreign Application Priority Data
Sep. 1, 2000 (JP) ........................................ 2000-265786

(51) Int. Cl.[7] ............................................ H01L 29/812
(52) U.S. Cl. ...................... 257/192; 257/190; 257/347; 257/352
(58) Field of Search ................................ 257/190, 192, 257/194, 200, 347, 352

(56) References Cited
U.S. PATENT DOCUMENTS
4,374,394 A * 2/1983 Camisa ........................ 257/664

(List continued on next page.)

FOREIGN PATENT DOCUMENTS
EP 0 871 228 A2 10/1998

(List continued on next page.)

OTHER PUBLICATIONS

K. Doverspike et al., "The Effect of GaN and AlN Buffer Layers on GaN Film Properties Grown on Both C–Plane and A–Plane Sapphue", Journal of Electronics Materials, vol. 24, No. 4, 1995, pp. 269–273.

(List continued on next page.)

Primary Examiner—Minhloan Tran
Assistant Examiner—Thomas L. Dickey
(74) Attorney, Agent, or Firm—Sughrue Mion, PLLC

(57) ABSTRACT

A group III nitride semiconductor device of field effect transistor type having improved productivity, reduced parasitic capacitances adapted for excellent device performance in high-speed operation as well as good heat diffusion characteristics. The device includes an epitaxial growth layer of a group III nitride semiconductor with a buffer layer laid under it, formed on an A plane (an (11–20) plane) of a sapphire. Thereon a gate electrode, a source electrode, a drain electrode, and pad electrodes are formed, and a ground conductor layer is formed on the back face of the sapphire substrate. A thickness of said sapphire substrate $t_{sub}$ satisfies the following Equation (1).

$$t_{sub} \leq 10 \frac{\varepsilon_{sub} S_{pad}}{\varepsilon_{epi} S_{gate}} t_{act}$$

where
$S_{pad}$ is an area of the pad electrode;
$S_{gate}$ is an area of the gate electrode;
$\varepsilon_{sub}$ is a relative permittivity of the sapphire substrate in the direction of the thickness;
$\varepsilon_{epi}$ is a relative permittivity of the group III nitride semiconductor layer in the direction of the thickness;
$t_{sub}$ is a thickness of the sapphire substrate; and
$t_{act}$ is an effective thickness of the group III nitride semiconductor layer.

10 Claims, 5 Drawing Sheets

U.S. PATENT DOCUMENTS

| | | | | |
|---|---|---|---|---|
| 5,408,120 A | * | 4/1995 | Manabe et al. | 257/431 |
| 6,069,394 A | * | 5/2000 | Hashimoto et al. | 257/466 |
| 6,441,391 B1 | * | 8/2002 | Ohno et al. | 257/11 |

FOREIGN PATENT DOCUMENTS

| | | |
|---|---|---|
| JP | 7-201745 A | 8/1995 |
| JP | 9-45988 A | 2/1997 |
| JP | 11-31864 A | 2/1999 |
| JP | 11-45892 A | 2/1999 |
| JP | 11-261169 A | 9/1999 |
| JP | 2000-223418 A | 8/2000 |

OTHER PUBLICATIONS

Journal of Crystal Growth, vol. 178, No. 1/2, 1997, pp. 168–173.

Applied Physics Letters, vol. 73, No. 5, Aug. 3, 1998, pp. 608–610.

2001 (Heisei 13nen) Shunki Dat 48kai, Ouyoa Butsuri–gaku Kankei Rengou Kouen–kai Kouen Yokoushuu. (Mar. 28, 2001) No. 3, pp. 1390–1392, 29–YC–4, 29a–YC–10.

Denshi Joho Tsuushin Gakkai Gijutsu Kenkyuu Houkou, Oct. 12, 2000, vol. 100, No. 371, pp. 37–42.

* cited by examiner (a)

(b)

(a)

(b)

Gate Width = 200 μm × 10
Gate Spacing = 30 μm
Power Supplied = 1W/mm ately, according to the
occasion and the purpose of use and so forth. In the field of
MMICs (Monolithic Microwave Integrated Circuits) or the
likes, there are some applications with small electric power
in which the restriction for heat diffusion is not strong. In
such applications, sapphire rather than SiC is in wide use.

GROUP III NITRIDE SEMICONDUCTOR DEVICE OF FIELD EFFECT TRANSISTOR TYPE HAVING REDUCED PARASITIC CAPACITANCES

TECHNICAL FIELD

The present invention relates to a field effect transistor (FET) with a sapphire substrate, in particular to a field effect transistor utilizing a group III nitride semiconductor material such as GaN.

BACKGROUND ART

The group III nitride semiconductors including GaN have carrier transport characteristics close to that of GaAs, together with high breakdown electric fields due to their wide band gaps. They are, thus, regarded as strong candidate materials for high frequency, high power transistors.

When a device is manufactured making use of a GaN based semiconductor material, because it is difficult to obtain a bulk GaN based substrate, there is normally employed a process for fabricating a device wherein a GaN based semiconductor layer is formed by epitaxial growth on a substrate of a different material. For the substrate of a different material, sapphire or SiC is utilized. SiC has an excellent thermal conductivity but also drawbacks of high cost and difficulty to attain a large wafer area. In contrast, although sapphire has an inferior thermal conductivity, the cost can be lowered through the use of a wafer with a larger diameter. In application, therefore, these substrates of different materials are chosen appropri When, using a sapphire substrate, a FET is fabricated, in prior art, a C plane sapphire is utilized and the device is formed on the C plane (Japanese Patent Application Laid-open, No. 82671/2000, Jpn. J. Appl. Phys., Vol. 38 (1999) pp. 2630 (T. Egawa et al.), etc.). FIG. 5 is a view showing a structure of a conventional MESFET (Metal Semiconductor FET) disclosed in FIG. 12 of Japanese Patent Application Laid-open, No. 82671/2000. Herein, upon a C plane sapphire substrate 51, a GaN buffer layer 52 and an n-type GaN channel layer 53 are laid, and a source electrode 54, a gate electrode 55 and a drain electrode 56 are formed thereon. Meanwhile, FIG. 6 is a view showing a structure of a conventional HEMT (High Electron Mobility Transistor) disclosed in FIG. 13 of the same publication. Upon a C plane sapphire substrate 61, a GaN buffer layer 62, an undoped GaN channel layer 63 and an n-AlGaN electron supplying layer 64 are laid, and a source electrode 65, a gate electrode 66 and a drain electrode 67 are formed thereon. In both of these cases, a GaN based semiconductor layer is laid upon a C plane of sapphire to fabricate a FET. Further, it is described, in that publication, that any plane of sapphire such as an A plane, N plane, S plane, R plane, M plane or the like may be utilized in fabricating an optical device or an electronic device with a sapphire substrate. However, examples specifically disclosed therein are nothing else but the ones of forming a device on a C plane of sapphire, and any specific processes for manufacturing or device design criteria for the cases to utilize any other plane are not described at all.

As described above, in conventional techniques, a GaN based semiconductor layer is formed upon a C plane of sapphire to form a device, which gives rise to the following problems.

First, attempts to obtain a wafer with a larger diameter are subjected to a certain restriction. In recent years, from the point of view of improving the productivity, there have been demands that wafers should have larger diameters. Yet, sapphire whose C plane is chosen as the crystal growth face cannot be readily made to have a larger diameter, because of its low workability through surface polishing due to its poor mechanical processing feasibility and little ability to grow the crystal to have a large width by the ribbon crystal method or the like. A substrate with the largest diameter attained so far is 4 inches in diameter.

Secondly, a heat radiation characteristic thereof is difficult to improve. Since sapphire has a low thermal conductivity, improvements on the heat radiation characteristic have been sought after for some time and, for this purpose, thinner substrates have been looked for. Nevertheless, sapphire has insufficient feasibility in mechanical processing as described above so that a reduction in thickness is hard to achieve and, thus, the heat radiation characteristic is difficult to improve.

Thirdly, parasitic capacitances generated in the substrate are relatively large and act as an inhibitory factor to the improvement of device performance. Especially, in the case of a C plane sapphire, it is necessary to make the substrate have a certain thickness from the point of mechanical processing feasibility, which results in generation of large parasitic capacitances in the substrate.

DISCLOSURE OF INVENTION

In light of the above problems, an object of the present invention is, in a group III nitride semiconductor device, to improve the productivity and heat radiation characteristic and, at the same time, to improve device performance through a reduction in parasitic capacitances.

The present invention relates to a semiconductor device which comprises a group III nitride semiconductor layer formed on a single crystalline sapphire substrate, a source electrode and a drain electrode formed apart from each other on the surface of said group III nitride semiconductor layer, and a gate electrode formed between said source electrode and said drain electrode; wherein said group III nitride semiconductor layer is formed on a plane which lies parallel to a C axis of said single crystalline sapphire substrate.

The present invention provides a semiconductor device which comprises a group III nitride semiconductor layer formed on a single crystalline sapphire substrate, a source electrode and a drain electrode formed apart from each other on the surface of said group III nitride semiconductor layer, and a gate electrode formed between said source electrode and said drain electrode; wherein said group III nitride semiconductor layer is formed on a plane lying parallel to a C axis of said single crystalline sapphire substrate; and a thickness of said single crystalline sapphire substrate is not greater than 100 μm.

Further, the present invention provides a semiconductor device which comprises a group III nitride semiconductor layer formed on a single crystalline sapphire substrate, a source electrode, a drain electrode and a pad electrode formed apart from one another on the surface of said group III nitride semiconductor layer, and a gate electrode formed between said source electrode and said drain electrode; wherein said group III nitride semiconductor layer is formed on a plane lying parallel to a C axis of said single crystalline sapphire substrate; and a thickness of said single crystalline sapphire substrate $t_{sub}$ satisfies the following Equation (1).

$$t_{sub} \leq 10 \frac{\varepsilon_{sub} S_{pad}}{\varepsilon_{epi} S_{gate}} t_{act} \quad (1)$$

where
$S_{pad}$ is an area of the pad electrode;
$S_{gate}$ is an area of the gate electrode;
$\varepsilon_{sub}$ is a relative permittivity of the sapphire substrate in the direction of the thickness;
$\varepsilon_{epi}$ is a relative permittivity of the group III nitride semiconductor layer in the direction of the thickness;
$t_{sub}$ is a thickness of the sapphire substrate; and
$t_{act}$ is an effective thickness of the group III nitride semiconductor layer.

Herein, the pad electrode refers to an electrode to supply electricity for a source or a drain from the outside. Further, $t_{act}$ (an effective thickness of the group III nitride semiconductor layer) represents a distance from an interface of the gate electrode and the surface of the semiconductor layer to a layer where carriers are present. For instance, in a HEMT, this refers to the distance between the lower end of the gate electrode and the two-dimensional electron gas layer, while, in a MESFET, this refers to the thickness of the depletion layer under the gate electrode.

In the present invention, as described above, a group III nitride semiconductor layer is formed on a plane lying parallel to a C axis of a single crystalline sapphire substrate and thereby a transistor is formed. A plane lying parallel to a C axis refers to an A plane, an M plane or the like of sapphire, including any plane whose offset angle with respect to one of these planes is less than 10°. Such a small angle offset does not much impair the effects of the present invention. Nevertheless, in order to attain the effects of the present invention more certainly, the offset angle is preferably set to be 5° or less.

FIG. 4 is a view illustrating the orientation of planes of sapphire. Therein, the (0001) plane is formed perpendicular to the C axis, and the (11–20) plane and the (1–100) plane are formed parallel to the C axis. In this drawing, formed are two {0001} planes (C planes) which are equivalent to the (0001) plane, six {11–20} planes (A planes) which are equivalent to the (11–20) plane, and six {1–100} planes (M planes) which are equivalent to the (1–100) plane, respectively. Upon the afore-mentioned A plane or M plane, and more preferably upon the A plane, a group III nitride semiconductor layer is formed to construct a FET in the present invention.

In the field of optical devices such as a semiconductor laser, there are some reports in which the technique to form a group III nitride semiconductor layer upon an A plane of sapphire is examined. For a GaN based optical device, too, although a C plane of a sapphire substrate is very often chosen as the crystal growth plane for a GaN based semiconductor layer, a proposal to use an A plane of sapphire as the crystal growth plane has been put forward, as described in Japanese Patent Application Laid-open No. 297495/1995.

Nevertheless, in the field of electronic devices including FETs, no attempts of forming a device on any plane other than the C plane, in particular on a sapphire A plane, has been made, which can be attributed to the following reasons.

For a FET making use of a group III nitride semiconductor, it is important to utilize carriers generated by the piezoelectric effect and spontaneous polarization effectively, in device designing. Therefore, for growing an epitaxial layer, it becomes essential to grow an epitaxial layer by using a crystal plane where the piezoelectric effect and spontaneous polarization take place effectively, namely a C plane of the group III nitride semiconductor layer, as a growth plane. In other words, in order to form an electronic device on a plane parallel to a C axis, it becomes important to grow a group III nitride semiconductor layer stably in the direction of the C axis. Furthermore, the growth of defects in the group III nitride semiconductor layer leads to inefficient piezoelectric effects through lattice relaxation so that defects such as dislocations need to be reduced. While a reduction of defects is required in a certain extent in the case of semiconductor lasers or the like, in the case of electronic devices where the structure of semiconductor layers is considerably different, the level of the defect reduction required is quite different.

Yet, conventional techniques have not given any clear guide leading to a process for forming a group III nitride semiconductor layer stably in the direction of a C axis while reducing defects.

Under these circumstances, in the field of electronic devices, when a sapphire substrate is employed, a C plane thereof is utilized as the plane for crystal growth, and no particular attempts of forming a device on a plane other than a C plane, including an A plane of sapphire, have been made.

In the present invention, a group III nitride semiconductor layer is formed upon a plane lying parallel to a C axis of a sapphire substrate such as an A plane to construct a FET. This provides the following advantages.

First, parasitic capacitances in the longitudinal direction of the substrate can be reduced, and by the reduction of parasitic capacitances in this direction, the device capability of high-speed operation can be improved. When a plane lying parallel to a C axis is chosen as the plane for crystal growth, the relative permittivity in the direction of the substrate thickness takes the value of 9.3. This presents a reduction of about 20%, in comparison with the relative permittivity of 11.5 when a C plane is utilized as the plane for crystal growth. This leads to a marked improvement in the device capability of high-speed operation.

Secondly, the device can be manufactured using a substrate with a large diameter so that the productivity can be greatly improved. For instance, as it is possible to fabricate an A plane sapphire having a diameter as large as 8 inches or so, the productivity with the present invention can be raised much higher than that with the conventional technique utilizing a C plane sapphire.

Thirdly, particularly when an A plane sapphire is employed, as the substrate has a superior feasibility in mechanical processing, the substrate thickness can be made thinner than that with a C plane sapphire. In practice, its thickness can be made 100 $\mu$m or less, even not greater than 50 $\mu$m. As a result, heat diffusion characteristic of the substrate can be markedly improved and besides parasitic capacitances in the longitudinal direction of the substrate can be reduced even further.

In the present invention, when the thickness of the sapphire substrate is set to be 100 $\mu$m or less, the heat diffusion characteristic of the substrate can be markedly improved and besides parasitic capacitances in the longitudinal direction of the substrate can be reduced still further.

Further, in the present invention, by setting the thickness of the sapphire substrate to satisfy the following equation:

$$t_{sub} \leq \frac{1}{\alpha} \frac{\varepsilon_{sub} S_{pad}}{\varepsilon_{epi} S_{gate}} t_{act},$$

where
$S_{pad}$ is the area of the pad electrode;
$S_{gate}$ is the area of the gate electrode;

$\epsilon_{sub}$ is the relative permittivity of the sapphire substrate in the direction of the thickness;

$\epsilon_{epi}$ is the relative permittivity of the group III nitride semiconductor layer in the direction of the thickness;

$t_{sub}$ is the thickness of the sapphire substrate;

$t_{act}$ is the effective thickness of the group III nitride semiconductor layer; and α is the coefficient, the degradation of the FET high frequency characteristic caused by parasitic capacitances that is attributed to the pad electrodes can be suppressed. Now, referring to the drawings, the point described above is explained in detail below.

FIG. 3 is a schematic view showing a structure of a GaN based HEMT. Herein, upon a sapphire substrate 2, a GaN based semiconductor epitaxial growth layer 3 is laid and, on its surface, a gate electrode 4 and a pad electrode 5 are formed. In this figure, source and drain electrodes, interconnections and the likes are omitted.

On the back face of the sapphire substrate 2, a ground conductor layer 1 is set. The pad electrode fills the role of supplying the transistor with electric power fed from the outside. In the transistor having such a structure, parasitic capacitances $C_1$ and $C_2$ are generated immediately under the gate electrode 4 and immediately under the pad electrode 5, respectively, as illustrated in the figure. The amounts of $C_1$ and $C_2$ can be expressed as follows:

$$C_2 = \varepsilon_0 \frac{\varepsilon_{sub}\varepsilon_{epi}}{\varepsilon_{epi}t_{sub} + \varepsilon_{sub}t_{epi}} S_{pad} \approx \varepsilon_0 \varepsilon_{sub} S_{pad} / t_{act} \quad (A)$$

$$C_1 = \varepsilon_0 \varepsilon_{epi} S_{gate} / t_{act} \quad (B)$$

where $S_{pad}$ is the area of the pad electrode;

$S_{gate}$ is the area of the gate electrode;

$\epsilon_{sub}$ is the relative permittivity of the sapphire substrate 2;

$\epsilon_{epi}$ is the relative permittivity of the GaN based semiconductor epitaxial growth layer 3;

$t_{sub}$ is the thickness of the sapphire substrate 2;

$t_{epi}$ is the thickness of the GaN based semiconductor epitaxial growth layer 3; and $t_{act}$ is the effective thickness of the GaN based semiconductor epitaxial growth layer 3.

While the GaN based semiconductor epitaxial growth layer is normally equal to or less than 1 μm, and for instance, within 0.02 to 0.05 μm in thickness, the substrate thickness is, for example, as large as 10 μm so that the approximation presented in Equation (A) can be accepted. If the amount of the parasitic capacitance $C_2$ due to the pad electrode is made to be within 10% and preferably within 5% of the amount of the parasitic capacitance $C_1$ due to the gate electrode, degradation of high frequency characteristic for a transistor can be suppressed.

With the condition of 10% limit being taken, the contribution of the parasitic capacitance $C_2$ becomes significant, when condition following is satisfied:

$$C_2 \geq C_1 \times 0.1$$

Substituting the above Equations (A) and (B) into this equation, the following Equation (1) is given.

$$t_{sub} \leq 10 \frac{\varepsilon_{sub} S_{pad}}{\varepsilon_{epi} S_{gate}} t_{act} \quad (1)$$

When a substrate thickness satisfying this equation is taken, the contribution of the parasitic capacitance under the pad electrode becomes significant and, thus, an application of the present invention that reduces the relative permittivity in the direction of the substrate thickness becomes even more effective. That is, aiming at success in improving heat diffusion characteristic and reducing the parasitic capacitances in the direction of the substrate thickness, it is preferable to make the substrate thickness as thin as possible. However, in conventional techniques making use of a C plane of sapphire, not only the feasibility in mechanical processing of the substrate is insufficient but also a problem of generation of the parasitic capacitance under the pad electrode may arise if a substrate thickness satisfying Equation (1) is taken so that there is a limitation to thin the substrate. In contrast, according to the present invention which reduces the relative permittivity in the direction of the substrate thickness, since the absolute value of the parasitic capacitance under the pad electrode can be lessened, the contribution of the parasitic capacitance under the pad electrode can be eliminated even if the sapphire substrate is made thin; and degradation of high frequency characteristic of the FET can be also prevented.

Herein, the values of respective parameters are normally in the following ranges.

$S_{pad}/S_{gate}$: 10 to 1000

$\epsilon_{sub}$: 9.4 to 11.4

$\epsilon_{epi}$: approximately 9.0

$t_{sub}$: 10 to 600 μm (below 10 μm, a faulty operation of the transistor may arise)

$t_{act}$: 0.02 to 0.05 μm

Taking the above ranges of the parameters into consideration, the range where the contribution of the parasitic capacitances under the pad electrode becomes significant is expressed by $$t_{sub} \leq 50 \text{ μm}.$$

Similarly, if the condition of 5% limit is taken, in the range of $$t_{sub} \leq 100 \text{ μm},$$

the contribution of the parasitic capacitances under the pad electrode becomes noticeable.

The above explanation is concerned with the range of the substrate thickness where the effects of the present invention become more evident, taking a HEMT as an example, but the similar holds for a MESFET. In the case of a HEMT, $t_{act}$ is the distance between the gate electrode and the two-dimensional electron gas layer. In the case of a MESFET, by defining $t_{act}$ as "the thickness of the depletion layer under the gate electrode", the similar argument to the above can be applied thereto, and thus Equation (1) is applicable to every transistor. Further, as the values of respective parameters normally employed for a MESFET are similar to those mentioned above, the range of $t_{sub}$ expressed by Equation (1) is also applied to every transistor.

BRIEF DESCRIPTION OF DRAWINGS

FIG. 1(a) is a cross-sectional view showing the construction thereof, and the lower view FIG. 1(b) illustrates the lines of electric force present in the device.

FIG. 2(a) is a top view showing an example of construction composed of electrodes aligned precisely along the direction of the C axis of sapphire, and the lower view FIG. 2(b) is a top view showing an example of construction composed of electrodes aligned along the direction tilted from the C axis by offset angle α.

BEST MODE FOR CARRYING OUT THE INVENTION

Figure 1:
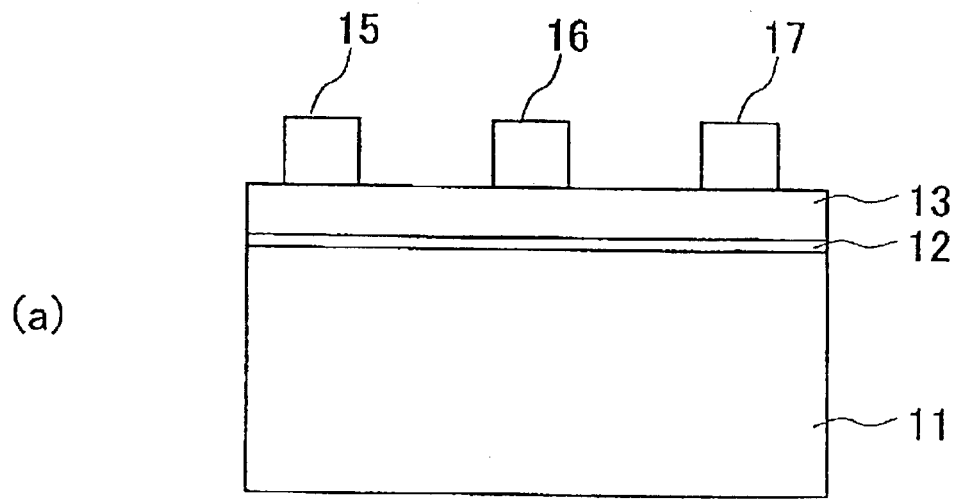
FIG. 1 is a couple of views showing a semiconductor device according to the present invention; the upper view
Figure 1:
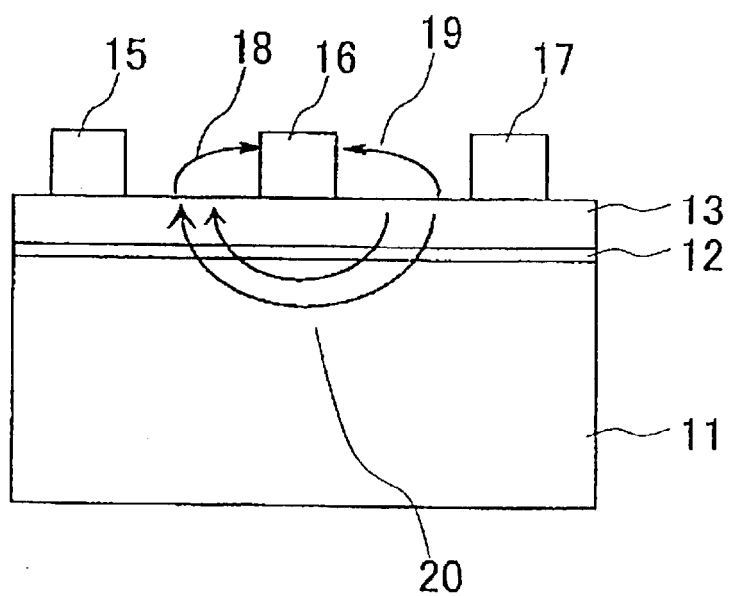

The term "the group III nitride semiconductor" in the present invention refers to any semiconductor containing nitrogen as a group V element, including a gallium nitride based semiconductor such as GaN, AlGaN, InGaN, AlGaInN, and also a semiconductor such as AlN, InN.

The present invention can be applied to either of a HEMT and a MESFET. When applied to a HEMT, it takes a structure in which group III nitride semiconductor layers comprise an operation layer and an electron supply layer formed thereon and at the interface of these layers, a two-dimensional electron gas is formed.

In the present invention, a group III nitride semiconductor layer is formed on a plane lying parallel to a C axis to construct a FET, which has not been hitherto investigated. In order to form a group III nitride semiconductor layer on a plane lying parallel to a C axis and fabricate stably a FET of high quality, it is important to select appropriately a substrate surface treatment prior to the epitaxial growth, growth conditions and so on. For instance, as described below, it is effective to perform, as a pretreatment prior to the epitaxial growth, an annealing in oxygen or hydrogen under the condition where the temperature is 1100° C. or higher and the duration is 30 minutes or longer. The upper limits for the temperature and the duration can be satisfactorily set to be, for example, not higher than 1600° C. and not longer than 120 minutes, respectively. In addition to this, a technique such as to set the epitaxial growth rate in an appropriate range is effective. With such a technique aforementioned, an epitaxial growth layer of high quality where the piezoelectric effect and spontaneous polarization may steadily take place can be obtained.

Now, referring to the drawings, the preferred embodiments of the present invention are described below.

FIG. 1 is a pair of views showing a structure of an AlGaN/GaN hetero-junction FET of the present embodiment. A process for manufacturing this FET is described below.

First, an A plane sapphire substrate (the principal plane is a (11–20) plane) with a diameter of 8 inches is prepared. After cleaning the substrate surface, an annealing is performed in oxygen or hydrogen under the condition, for example, such as at the temperature of 1200° C. and for 60 minutes. In addition to this annealing, an appropriated selection of a growth rate of a semiconductor layer can make the gallium nitride based semiconductor layer grow stably in the direction of a C axis. The defect density of the obtained semiconductor layer can be also made relatively small.

The growth of the gallium nitride based semiconductor layer can be conducted, for example, by the MOVPE (Metallo-Organic Vapour Phase Epitaxy) method, as follows. First, at such a low temperature of 400 to 650° C., a buffer layer 12 of AlN or GaN is formed. After raising the temperature, an epitaxial layer 13 is grown that comprises a gallium nitride based semiconductor material, which is to constitute the FET.

Using a resist as a mask, N ions are then implanted in so as to isolate an n-layer. The implantation condition is that, for example, an accelerating energy is 100 keV and a dose density is $10^{14}$ cm$^{-2}$.

Next, after Ti and Al are laid by the lift-off technique, an annealing is carried out to form a source electrode 15, a drain electrode 17 and a pad electrode (not shown in the drawing).). The layer thickness of Ti and Al are set to be, for example, 20 nm and 200 nm, respectively. The annealing is carried out, for example, at 650° C. for 30 seconds in nitrogen atmosphere.

Next, Ni and Au are laid by the lift-off technique to form a gate electrode 16. The layer thickness of Ni and Au are set to be, for example, 20 nm and 200 nm, respectively.

Subsequently, an oxide film or a SiN film for a protective film is grown and through holes for making contact are formed, and then, by the step of gold plating, an interconnection section is formed. After that, a wafer on which devices are formed is thinned to a thickness of 10 to 50 μm by such a means as polishing, and, then, broken into chips by dicing. In dicing, it is preferable to utilize (0001) planes and (1–100) planes. By conducting dicing after scribing along intersections of these planes first, dicing can be carried out relatively easily. Thereby, a FET with a structure shown in FIG. 1 can be obtained.

Figure 3:
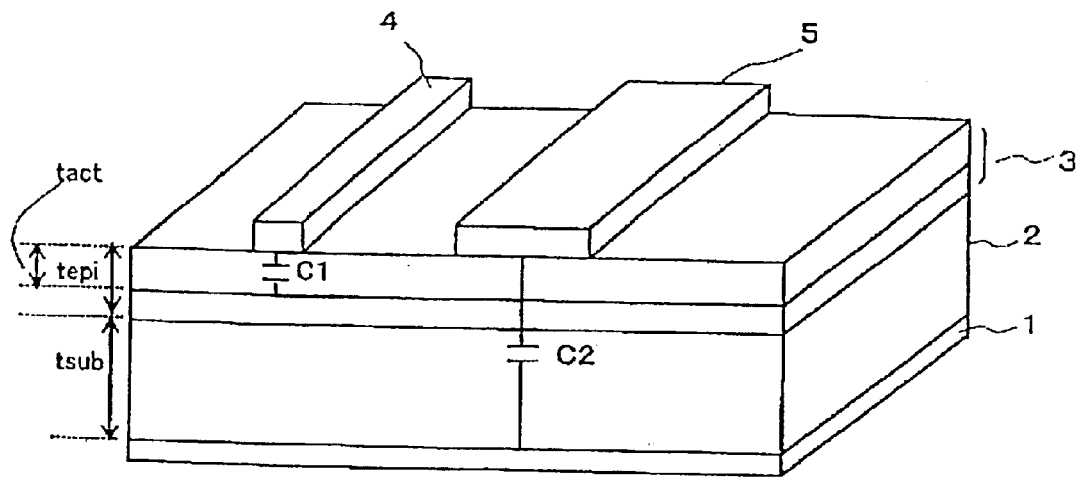
FIG. 3 is a view in explaining the operation of the invention in a semiconductor device according to the present invention.
Figure 4:
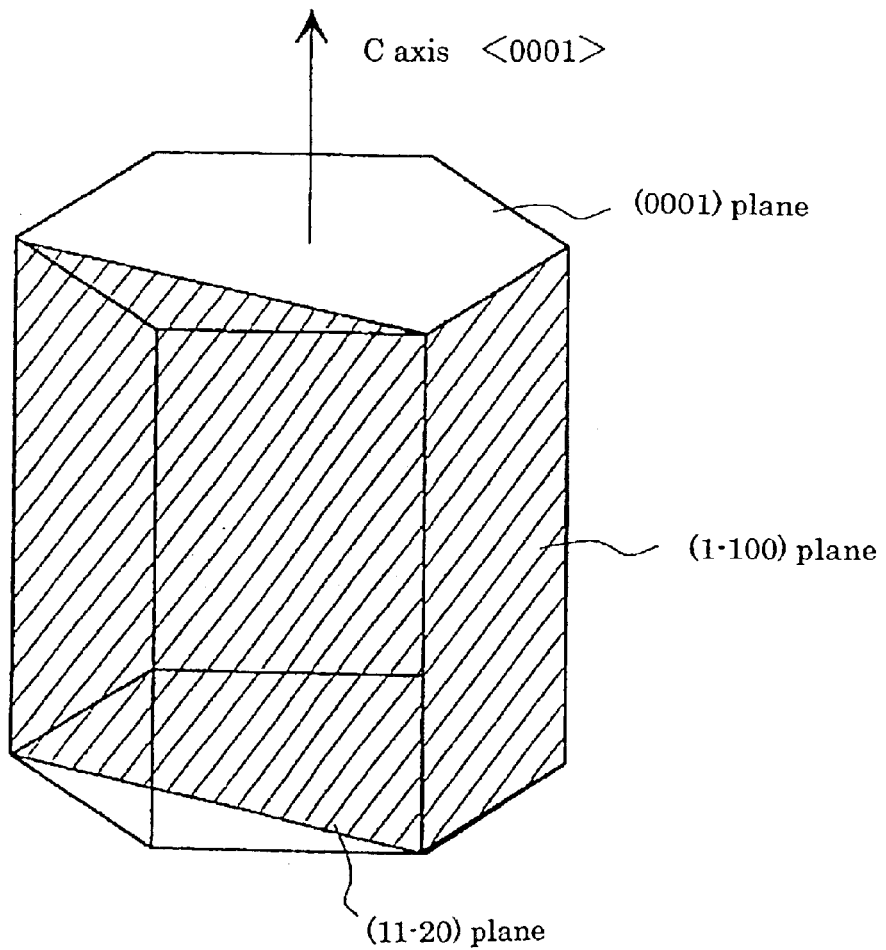
FIG. 4 is a view illustrating the orientation of planes in a single crystalline sapphire.
Figure 5:
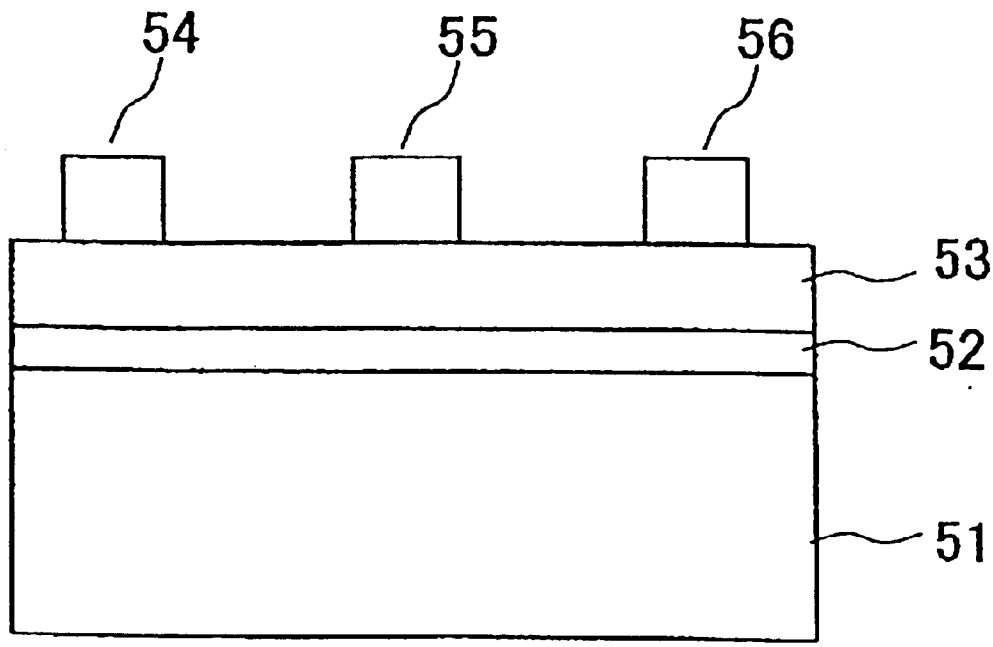
FIG. 5 is a cross-sectional view showing a construction of a conventional semiconductor device, in particular of a MESFET.
Figure 6:
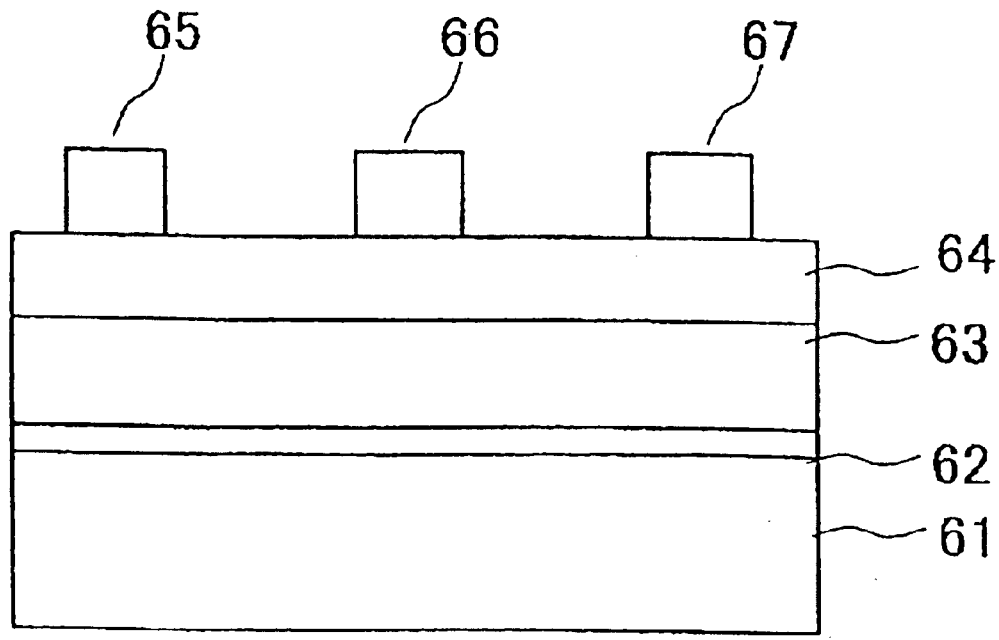
FIG. 6 is a cross-sectional view showing a construction of a conventional semiconductor device, in particular of a HEMT.

The relative placement between a FET of the present embodiment and the pad electrode as well as the substrate is as shown in FIG. 3. Herein, the values of respective parameters are as follows.

$S_{pad}/S_{gate}$: 100

$\varepsilon_{sub}$: 9.4

$\varepsilon_{epi}$: approximately 9.0

$t_{sub}$: 10 to 100 μm $t_{act}$: 0.02 to 0.05 μm

As described above, the substrate thickness with which a problem of the parasitic capacitance due to the pad electrode becomes significant is given by the following Equation (1).

$$t_{sub} \leq 10 \frac{\varepsilon_{sub} S_{pad}}{\varepsilon_{epi} S_{gate}} t_{act} \qquad (1)$$

Taking the above ranges of the parameters into consideration, in this example of the present embodiment, the problem of the pad electrode parasitic capacitance becomes significant in the range of $$t_{sub} \leq 52 \ (\mu m).$$

In the present embodiment, aiming at success in improving heat diffusion characteristic and reducing the parasitic capacitances in the direction of the substrate thickness, the substrate thickness is set to be 10 to 50 μm. When the device is formed on a C plane of sapphire as the conventional one, with such a substrate thickness, the pad electrode parasitic capacitance may cause a problem, but, in the present embodiment, such a problem is solved by utilizing an A plane of sapphire as the plane for device formation.

Further, in the present embodiment, the layout in a plane of the FET is set to satisfy a prescribed condition, which enhances its high frequency performance For a high frequency FET, in order to enhance a high frequency performance, the reduction of parasitic capacitance due to the drain electrode, which functions as a signal output electrode, is a matter of more importance. The state of the electric field in a FET of the present embodiment, when operating, is illustrated in FIG. 1(b). In FIG. 1(b), a line of electric force 18 drawn from the source to the gate corresponds to a parasitic capacitance $C_{gs}$ between the gate and the source, while a line of electric force 19 drawn from the drain to the gate corresponds to a parasitic capacitance $C_{gd}$ between the gate and the drain. Further, a line of electric force 20 drawn from the source to the drain corresponds to a parasitic capacitance $C_{ds}$ between the drain and the source.

Meanwhile, the cut-off frequency $f_T$ of the FET, dependent on the $C_{ds}$ and $C_{gd}$, both of which are parasitic capacitances attributed to the drain electrode, can be expressed approximately by the following equation, when the transconductance is denoted by $G_m$.

$$f_T = G_m / 2\pi(C_{gd} + C_{ds})$$

Here, $C_{gd}$ is dependent on the relative permittivity of the epitaxial layer 13 and hardly affected by the relative permittivity of the sapphire substrate 11. On the other hand, in respect of $C_{ds}$, a line of electric force 20 corresponding to it passes through the sapphire substrate 11, and its value depends partially on the relative permittivity of the sapphire substrate 11.

Taking the above into consideration, the present inventors conducted device simulations of a FET having a gate length of 1 μm, a source-drain gap of 3 μm and a GaN film thickness of 0.5 μm, as for models where the relative permittivity of the substrate lying under it was assumed to be 9.3 or 11.5, respectively. In a model wherein the relative permittivity of the substrate was 9.3, the resulting cut-off frequency in the saturation region with $V_{DD}$=10 V was estimated to be 24.5 GHz. In the other model wherein the relative permittivity of the substrate was 11.5, the cut-off frequency was estimated to be 23.3 GHz, indicating clearly there was a difference of about 5% between these two models. In effect, the operational speed changes by 5% with the direction in which the FET is placed on an A plane of sapphire. If the gate electrode, the source and drain electrodes are disposed to lie parallel to the C axis of sapphire, the speed of FET operation increases by 5% or so, compared with that of the case in which their lying direction is perpendicular thereto.

Figure 2:
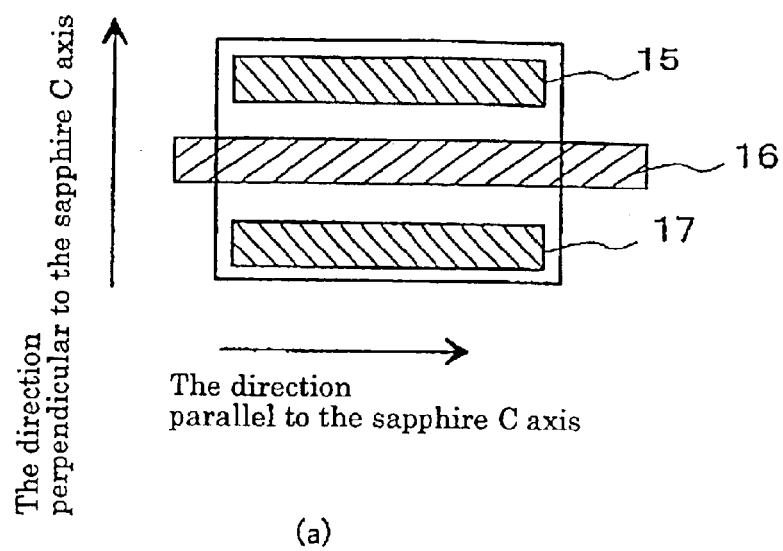
FIG. 2 is a pair of top views each showing an example of semiconductor devices according to the present invention; the upper view
Figure 2:
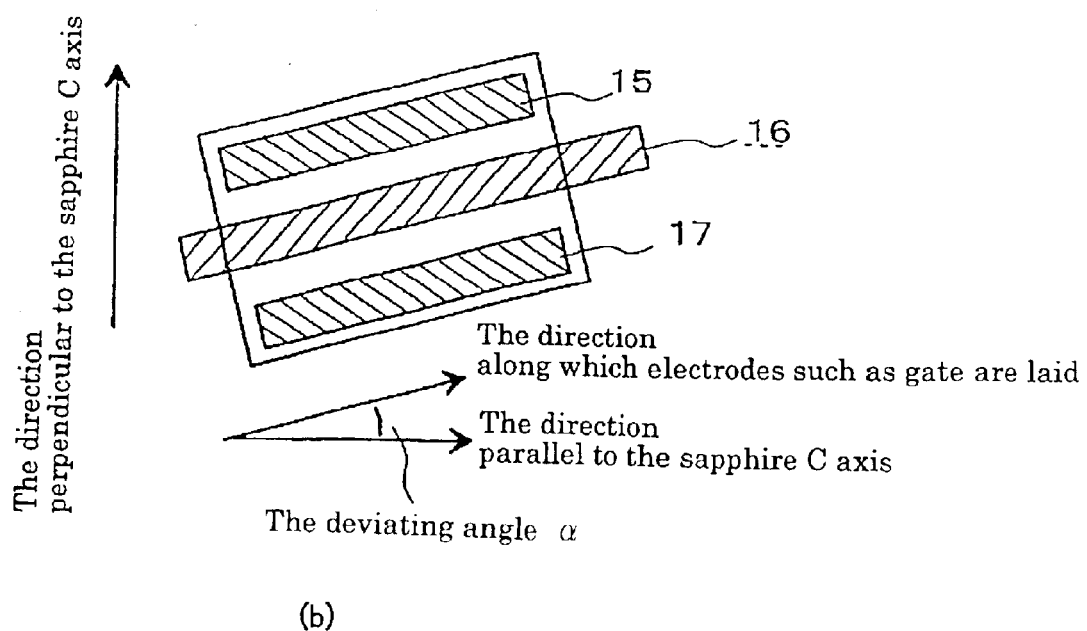

Next, the results of investigations for the relationship between the layout and the performance of the FET are shown below. When the angle (the deviating angle) forming between the direction along which the gate electrode and the source and drain electrodes of the FET lie and the C axis of the sapphire substrate is taken as α, as shown in FIG. 2 (b), the relationship between α and the amount of speed reduction (the amount of speed reduction given by comparison with the speed at α=0) is as shown in the following Table 1.

TABLE 1

| Deviating Angle α (degree) | Amount of Speed Reduction (%) |
|---|---|
| 0 | 0 |
| 12 | 0.1 |
| 16 | 0.2 |
| 20 | 0.3 |

As, in practice, it is desirable to keep the amount of speed reduction 0.3% or less, in other words, to make the operational speed 99.7% or more of the maximum speed, the deviating angle α with respect to the direction in the layout to provide the maximum speed is preferably set to be 20° or less.

Further, when the sapphire A plane is utilized, the anisotropy of the permittivity exists on the plane for device formation, which results in a difference in signal propagation characteristic between pair-transistors and becomes a factor to cause a distortion in the operational amplifier and the like. The amount of this distortion which is proportional to the square value of sin α has the relationship listed in the following Table 2.

TABLE 2

| Deviating Angle α (degree) | Amount of Distortion (%) |
|---|---|
| 6 | 1 |
| 10 | 3 |
| 30 | 25 |
| 45 | 50 |
| 90 | 100 |

As in practice, it is desirable that the amount of distortion is kept to be preferably 3% or less and more preferably 1% or less, set to be preferably 10° or less and more preferably 6° or less with a view to reducing the amount of distortion.

Accordingly, in the present embodiment, the layout in plane of the FET is set as shown in FIG. 2(b) and an angle a made between the direction along which the gate electrode, the source 15 and drain electrodes lie and the direction of the sapphire C axis is set to be within 6°. The direction of the drain current is, therefore, substantially perpendicular to the sapphire C axis. Through this arrangement, a FET with an excellent performance in high-speed operation can be obtained.

EXAMPLES

Example 1

FIG. 1 shows the structure of an AlGaN/GaN heterojunction FET of the present example. This FET was fabricated by a process which comprises the steps of growing a gallium nitride semiconductor layer upon an A plane sapphire substrate (the principal plane thereof is a (11–20) plane) with a diameter of 8 inches, forming electrodes and so on, and thereafter polishing the substrate to a thickness of 30 μm and then breaking into chips.

The manufacturing method thereof was the similar one to that mentioned in "Bst Modes for Carrying out the Invention" above. An annealing after cleaning of the substrate surface was performed in oxygen at 1200° C. The growth temperature for a low-temperature buffer layer 12 was set at about 650° C., and for other layers 13 at about 1050° C., respectively. The epitaxial layers 13 were made to have a structure wherein the following layers were laid in this order: that is an AlN buffer layer (with a thickness of 100 µm);
a GaN layer (with a thickness of 0.5 µm);
a non-doped $Al_{0.2}Ga_{0.8}N$ layer (with a thickness of 5 nm);
a $4\times10^{18}$ cm$^{-3}$ Si-doped $Al_{0.2}Ga_{0.8}N$ layer (with a thickness of 15 nm); and
a non-doped $Al_{0.2}Ga_{0.8}N$ layer (with a thickness of 5 nm).
Further, dicing was performed by utilizing (0001) plane and (1–100) plane.

Further, in a FET of the present example, the values of afore-mentioned parameters were as follows:

$S_{pad}/S_{gate}$ is 100;
$\epsilon_{sub}$ is 9.4;
$\epsilon_{epi}$ is approximately 9.0;
$t_{sub}$ is 30 µm; and
$t_{act}$ is 0.05 µm.

By substituting the above parameters into the afore-mentioned Equation (1), the range of the substrate thickness where the problem of the parasitic capacitances due to the pad electrode becomes significant is given by $$t_{sub} \leq 52 \text{ µm}.$$

In the present example, the substrate thickness was set to be 30 µm with a view of improving heat radiation characteristic and reducing parasitic capacitances in the direction of the substrate thickness. When the device is formed on a sapphire C plane as the conventional one, with a substrate thickness as thick as that, the pad electrode parasitic capacitances cause a problem. In contrast, in the present example, such a problem is solved, because an A plane of sapphire is utilized as the plane for device formation.

In addition, in the present example, the layout in plane of the FET was set, as shown in FIG. 2(a), where directions along which a gate electrode, source and drain electrodes lie was substantially parallel to the sapphire C axis. The direction of the drain current is, thus, substantially perpendicular to the sapphire C axis. As the orientation of the C axis within a wafer can be found out beforehand through measurements of X-ray analysis or such, it can be easily recognized by marking its direction with a notch or the like. Further, in mask design, if interconnections between FETs are laid in the direction parallel or perpendicular to that of the FETs, the area of a rectangular chip can be utilized effectively. Further, coplanar lines may be employed for interconnections and, in such a case, it is preferable to adjust impedances by varying spacing between lines, while taking the difference in permittivity into consideration.

A FET obtained in the present example demonstrated to have excellent productivity, heat diffusion characteristic and performance in high-speed operation.

Reference Example 1

Figure 7:
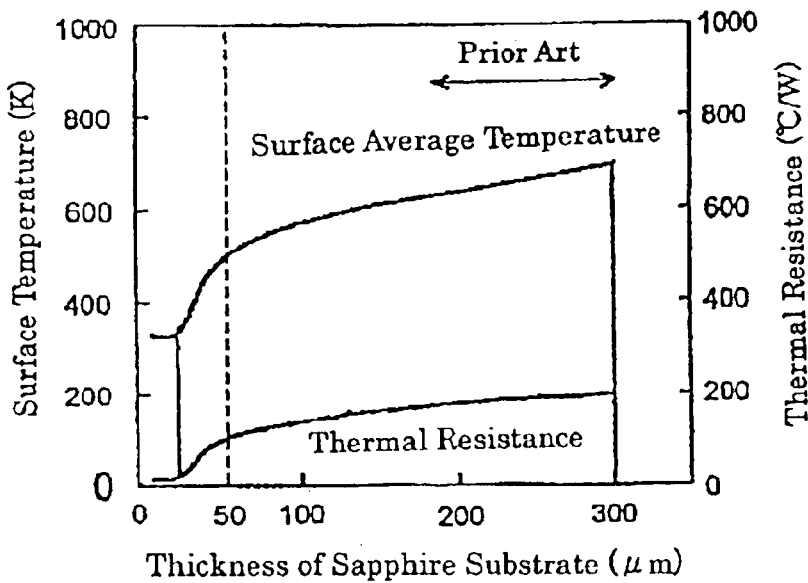
FIG. 7 is a graphical representation showing the dependences of thermal resistance and surface average temperature on substrate thickness, obtained by simulation.
Figure 8:
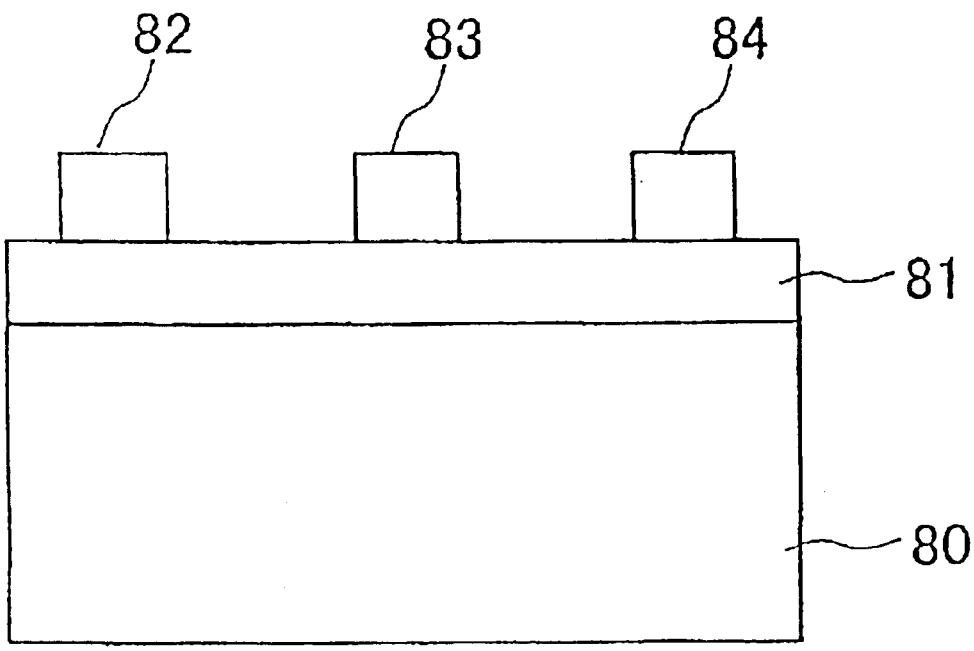
FIG. 8 is a view in explaining the model subjected to analysis made by simulation of FIG. 7.

Subjecting a HEMT shown in FIG. 8 to analysis where a GaN based semiconductor layer 81 is formed upon a sapphire substrate 80 and a source electrode 82, a gate electrode 83 and a drain electrode 84 are formed thereon, the dependences of thermal resistance and surface average temperature on substrate thickness were obtained by simulation. The calculated results are shown in FIG. 7. The thermal resistance and surface average temperature each decrease with decreasing the substrate thickness, and show a marked decrease, especially in the region of thickness of 50 µm or less. These results confirm that, by setting the thickness of the sapphire substrate to be 50 µm or less, a noticeable effect to heat diffusion can be attained.

Reference Example 2

A sapphire substrate with a thickness of 300 µm wherein an A plane was set to be the principal plane and another sapphire substrate with a thickness of 300 µm wherein a C plane was set to be the principal plane were prepared, and, after polishing, close inspection of their aspects were conducted. In the sapphire substrate wherein a C plane was set to be the principal plane, cracks appeared when its thickness came down to 70 µm or so. In contrast, in the sapphire substrate wherein an A plane was set to be the principal plane, cracks did not appear, even when the substrate thickness became as thin as 30 µm, showing nothing abnormal in appearance.

INDUSTRIAL APPLICABILITY

As set forth above, in the present invention, a group III nitride semiconductor layer is formed upon a plane which lies parallel to a C axis of a single crystalline sapphire substrate to construct a FET. This makes it possible to provide a good productivity as well as to reduce the parasitic capacitances arisen in the direction of the substrate thickness and improve performance in high-speed operation of the FET. Further, as the thickness of the substrate is set in a prescribed range, the heat diffusion characteristic can be markedly improved and moreover the effect of the parasitic capacitance attributed to the pad electrode can be eliminated so that still better performance in high-speed operation can be achieved.

What is claimed is:

1. A semiconductor device which comprises
a group III nitride semiconductor layer formed on a single crystalline sapphire substrate,
a source electrode and a drain electrode with pad electrodes thereof formed apart from each other on the surface of said group III nitride semiconductor layer,
a gate electrode formed between said source electrode and said drain electrode, and
a around conductor layer being set on the back face of said single crystalline sapphire substrate; wherein
said group III nitride semiconductor layer is formed on a plane lying parallel to a C axis of said single crystalline sapphire substrate; and a thickness of said single crystal sapphire substrate is not greater than 100 µm.

2. A semiconductor device which comprises
a group III nitride semiconductor layer formed on a single crystalline sapphire substrate,
a source electrode, a drain electrode and pad electrodes thereof formed apart from one another on the surface of said group III nitride semiconductor layer,
a gate electrode formed between said source electrode and said drain electrode, and
a ground conductor layer being set on the back face of said single crystalline sapphire substrate; wherein
said group III nitride semiconductor layer is formed on a plane lying parallel to a C axis of said single crystalline sapphire substrate; and a thickness of said single crystalline sapphire substrate $t_{sub}$ satisfies the following Equation (1), $$t_{sub} \leq 10 \frac{\varepsilon_{sub} S_{pad}}{\varepsilon_{epi} S_{gate}} t_{act}, \tag{1}$$

where
$S_{pad}$ is an area of the pad electrode;
$S_{gate}$ is an area of the gate electrode;
$\epsilon_{sub}$ is a relative permittivity of the sapphire substrate in the direction of the thickness;

$\epsilon_{epi}$ is a relative permittivity of the group III nitride semiconductor layer in the direction of the thickness;

$t_{sub}$ is a thickness of the sapphire substrate; and $t_{act}$ is an effective thickness of the group III nitride semiconductor layer.

3. A semiconductor device according to claim 1, wherein a thickness of said sapphire substrate is not greater than 50 μm.

4. A semiconductor device according to claim 1, wherein said plane lying parallel to a C axis is an A plane of sapphire.

5. A semiconductor device according to claim 2, wherein a thickness of said sapphire substrate is not greater than 50 μm.

6. A semiconductor device according to claim 2, wherein said plane lying parallel to a C axis is an A plane of sapphire.

7. A semiconductor device according to claim 3, wherein said plane lying parallel to a C axis is an A plane of sapphire.

8. A semiconductor device according to claim 5, wherein said plane lying parallel to a C axis is an A plane of sapphire.

9. A semiconductor device according to claim 1, wherein said group III nitride semiconductor layer comprises an operation layer and an electron supply layer formed thereon, and a two-dimensional electron gas is formed at the interface of said operation layer and said electron supply layer.

10. A semiconductor device according to claim 2, wherein said group III nitride semiconductor layer comprises an operation layer and an electron supply layer formed thereon, and a two-dimensional electron gas is formed at the interface of said operation layer and said electron supply layer.

* * * * *

UNITED STATES PATENT AND TRADEMARK OFFICE
CERTIFICATE OF CORRECTION

| | |
|---|---|
| PATENT NO. | : 6,765,241 B2 |
| APPLICATION NO. | : 10/362883 |
| DATED | : July 20, 2004 |
| INVENTOR(S) | : Yasuo Ohno et al. |

It is certified that error appears in the above-identified patent and that said Letters Patent is hereby corrected as shown below:

On the title page:
In the "(*) Notice" section, please add --This patent is subject to a terminal disclaimer--

Signed and Sealed this

Eighteenth Day of September, 2007

JON W. DUDAS
*Director of the United States Patent and Trademark Office*